United States Patent [19]

Kozlovsky et al.

[11] Patent Number: 5,313,483

[45] Date of Patent: May 17, 1994

[54] LASER SCREEN FOR A CATHODE-RAY TUBE AND METHOD FOR MAKING SAME

[75] Inventors: Vladimir I. Kozlovsky, Moscow; Andrey A. Kolchin, Moscow, both of U.S.S.R.

[73] Assignees: Principia Optics, Inc., Los Angeles, Calif.; P.N. Lebedev Institute of Physics, Moscow, U.S.S.R.

[21] Appl. No.: 875,816

[22] Filed: Apr. 30, 1992

[30] Foreign Application Priority Data

Dec. 26, 1991 [SU] U.S.S.R. .............................. 5016146

[51] Int. Cl.$^5$ .............................................. H01S 3/19
[52] U.S. Cl. ........................................ 372/15; 372/49; 372/99; 372/34; 372/36
[58] Field of Search ...................... 372/45, 44, 49, 99, 372/34, 36

[56] References Cited

U.S. PATENT DOCUMENTS

| | | | |
|---|---|---|---|
| 3,182,224 | 5/1965 | Stone et al. | 315/21 |
| 3,267,209 | 8/1966 | Nagamori et al. | 178/5.4 |
| 3,316,432 | 4/1967 | Smith | 313/75 |
| 3,959,584 | 5/1976 | Todd, Jr. | 178/7.88 |
| 3,986,194 | 10/1976 | Masumoto et al. | 357/18 |
| 3,996,492 | 12/1976 | McGroddy | 315/500 |
| 4,099,092 | 7/1978 | Bristow | 315/10 |
| 4,140,941 | 2/1979 | Uemura | 313/495 |
| 4,160,935 | 7/1979 | Groot et al. | 315/370 |
| 4,291,256 | 9/1981 | Garwin | 315/368 |
| 4,456,853 | 6/1984 | Robinder et al. | 313/421 |
| 4,479,222 | 10/1984 | Hawrylo | 372/45 |
| 4,523,212 | 6/1985 | Hawrylo | 357/17 |
| 4,539,687 | 9/1985 | Gordon et al. | 372/43 |
| 4,565,947 | 1/1986 | Minn | 313/467 |
| 4,571,727 | 2/1986 | Nishizawa et al. | 372/4 |
| 4,626,739 | 12/1986 | Shmulovich | 313/469 |
| 4,634,922 | 1/1987 | Nill | 3132/402 |
| 4,695,332 | 9/1987 | Gordon et al. | 437/126 |
| 4,701,789 | 10/1987 | Bonye | 358/65 |
| 4,706,253 | 11/1987 | Su et al. | 372/44 |
| 4,714,956 | 12/1987 | Yin | 358/60 |
| 4,749,255 | 6/1988 | Chakrabarti et al. | 372/45 |
| 4,749,907 | 6/1988 | Boatwright et al. | 315/10 |
| 4,794,606 | 12/1988 | Kondow et al. | 372/45 |
| 4,813,049 | 3/1989 | Becla | 372/44 |
| 4,894,832 | 1/1990 | Colak | 372/44 |
| 4,945,223 | 7/1990 | Beauzamy | 250/213 |
| 4,955,031 | 9/1990 | Jain | 372/45 |
| 4,978,202 | 12/1990 | Yang | 351/331 |

FOREIGN PATENT DOCUMENTS

| | | | |
|---|---|---|---|
| 0149738 | 7/1981 | Fed. Rep. of Germany | H01S 3/18 |
| 2080609 | 7/1981 | United Kingdom | H01S 3/18 |

OTHER PUBLICATIONS

A. Nasibov, Laser Cathode Raytubes and Their Applications, SPIE vol. 893 High Power Laser Diodes and Application, 1988, pp. 200–202.

A. S. Nasibov and E. S. Shemchuk, Use of Laser Electron-Beam Tubes in Projection Television, Sov. J. Quantum Electron, Sep. 1978, pp. 1080–1085.

A. S. Nasibov, V. I. Kozlovsky, P. V. Reznikov, Ya. K. Skasyrsky and Yu. M. Popov, Full Color TV Projector Based on $A_2B_6$ Electron-Beam Pumped Semiconductor Lasers, Journal of Crystal Growth 117 (1992) 1040–1045.

Primary Examiner—Georgia Y. Epps
Attorney, Agent, or Firm—Marshall A. Lerner; John F. Sicotte

[57] ABSTRACT

In a laser screen for a cathode-ray tube having a semiconductor member of a semiconductor compound positioned between a partly transparent mirror and a reflecting mirror, an intermediate member is grown by deposition from vapor phase on the partly transparent mirror. The intermediate member is made of a semiconductor material transparent for radiation generated by the screen and has a bandgap width which is at least 0.98 times as great as the bandgap width of the material of the semiconductor member. The intermediate member is cemented to a transparent heat removing support member.

7 Claims, 2 Drawing Sheets

LASER SCREEN FOR A CATHODE-RAY TUBE AND METHOD FOR MAKING SAME

FIELD OF THE INVENTION

The invention relates to electronic equipment and, in particular, to high-brightness kinescopes that may be used in projection TV systems. The invention may also be used for projection photolithography. More specifically, the invention deals with a laser screen for a cathode-ray tube and with a method of making same.

BACKGROUND OF THE INVENTION

Laser screens for cathode-ray tubes are known to have an optical cavity with a semiconductor member between the mirrors defining the cavity (V. I. Kozlovsky et al. Laser Screens of CdS, $CdS_xSe_{1-x}$ and ZnSe Monocrystalline Ingots (in Russian). J. Kvantovaya Elektronika. Moscow. 1977. Vol. 4. No. 2. p. 351–354). The optical cavity is cemented to a transparent heat removing support member. Organic adhesive compositions are used to cement the optical cavity to the transparent support member. This laser screen cannot work with an acceptable efficiency for a long time at temperatures close to room temperature. If thickness of the single-crystal wafer is much greater than the typical depth of penetration of an electron beam into the laser screen, a strong absorption in the non-excited zone of the single-crystal wafer substantially lowers efficiency of lasing at room temperature. If the thickness of a single-crystal wafer is approximately the depth of the penetration of an electron beam into the laser screen, the efficiency of the laser screen remains high even at room temperature. However, service life of such laser screens is rather short because of a rapid decomposition of an organic cementing layer under the action of an electron beam partly penetrating the cementing layer if a small-thickness wafer is used. The service life is also shortened because of thermoelastic stresses at the boundary between the single-crystal wafer and cementing layer due to a low heat conductance of the cementing layer.

It is known to make a semiconductor laser with optical pumping, comprising a multiple-layer structure which consists of an active layer, reflecting layers, and a passive single-crystal epitaxial layer having different values of the bandgap width and different indices of refraction (Jewell, J. L. et al. Vertical Cavity Single Quantum Well Laser. Appl. Phys. Lett. 1989. Vol. 55. p. 424). This structure can be used as a laser screen for a cathode-ray tube. This device does not have a cementing layer because one layer of the structure is made thick enough to function as a heat removing support member. In addition all layers, including the mirror layers defining an optical cavity, are single-crystal layers. A structure like this is prepared by a method comprising epitaxial overgrowth of layers of different composition from organoelement compounds (Koyama F. et al. CaAlAs/GaAs MOCVD Growth for Surface Emitting Laser. Jap. J. of Appl. Phys. 1987. Vol. 26. No. 7. p. 1077–1081). This method can only be carried out with a high perfection of structure of grown substrates and fair agreement between parameters of lattices of all grown single-crystal layers. This surface emitting laser structure is also deficient in the fact that it can be grown only with the use of a limited number of $A^{III}B^V$ semiconductor compounds emitting only in the near infrared spectral area. These compounds cannot be used for lasing in the visible spectral area.

Another prior art laser screen has a transparent support member and a structure having a silver mirror coating, a semiconductor layer, a passive transparent semiconductor layer, and a partly transparent mirror which is cemented to the transparent support (Katsap, V. N. et al. Heterostructures $Cd_xSe_{1-x}$/CdS in Longitudinal Electron Beam Pumping Lasers (in Russian). J. Kvantovaya elektronika. Moscow. 1987. Vol. 14. No. 10. p. 1994–1997). A method for making this laser screen involves polishing a wafer having an appropriate orientation on the one side, overgrowing on this side a passive layer of a similar semiconductor compound having a wider bandgap, applying a partly transparent insulating coating to this layer, cementing the resulting structure to a support, polishing the opposite side of the wafer, and applying a reflecting mirror to this opposite side of the wafer. The passive layer is grown by static resublimation in a quasi-sealed space at 1175 to 1225K in argon or hydrogen. The boundary between the wafer and the passive layer in this laser screen is within the optical cavity formed by the partly transparent mirror and reflecting mirror. This method can be used for making laser screens of $A^{II}B^{VI}$ semiconductor compounds which radiate in the visible and near ultraviolet spectral areas. The passive layer thickness must be large enough because the cementing layer should be spaced to a desired distance from the zone excited by electron beam which is necessary to prolong service life. In addition, the bandgap width of the passive layer must be large enough in comparison with the bandgap width of the active layer so as to lower absorption in the passive layer. It is, however, difficult to overgrow the passive layer of such compounds by the procedure described above without impairing emitting efficiency of the active semiconductor. This results in the prior art laser screen having a low lasing efficiency at room temperature.

SUMMARY OF THE INVENTION

It is an object of the invention to provide a laser screen wherein the construction of the screen allows lasing efficiency at room temperature to be enhanced.

Another object of the invention is to provide a method of making a laser screen which ensures high lasing efficiency of the laser screen by using simple procedures.

Still another object of the invention is to prolong service life of the laser screen.

With these and other objects in view, a laser screen for a cathode-ray tube has a support and heat removing member, and an intermediate member, an optical cavity comprising a partly transparent mirror and a reflecting mirror, and a semiconductor member of a semiconductor compound positioned between the partly transparent mirror and the reflecting mirror. According to the invention, the intermediate member is made of a semiconductor material transparent for radiation generated by the screen having a bandgap width which is at least 0.98 times as great as the bandgap width of the material of the semiconductor member, the partly transparent mirror being formed on the semiconductor member, and the intermediate member being grown on the partly transparent mirror and cemented to the heat removing support member.

This construction is distinguished by the fact that the passive layer formed by the intermediate member is located outside the optical cavity. This allows the cementing layer to be disposed outside the zone in which excitation by electron beam occurs by introducing a passive layer so that lasing performance of the semiconductor member can be enhanced without impairing other properties of the laser screen. Moreover, the optical cavity length is determined in this case only by thickness of the semiconductor member. In comparison with the prior art this results in a generation threshold being lower with an increase in lasing efficiency. It should be noted that unlike what is known from the prior art, a partly transparent mirror is provided between the semiconductor member and the intermediate member. During manufacture this partly transparent mirror prevents interaction between the semiconductor member and the intermediate member. It should be noted that direct contact between these members during manufacture can result in an exchange with Sulfur and Selenium atoms if, for example, CdS(cadmium sulfide) is grown on CdSSe(cadmium sulfide selenide). Similar exchange can occur when other semiconductor compounds are used. Such process causes an appearance of a large number of point-like defects such as vacancies and interstitial atoms having very high coefficients of diffusion, which rapidly propagate through the layers and form non-emitting recombination centers which impair lasing properties of the semiconductor member, especially at room temperature. Relative diffusion of atoms between the layers can also occur in operation when it is stimulated by powerful exciting action of an electron beam. An intensive recombination of non-equilibrium charge carriers also contributes to the above-described relative diffusion of atoms. The laser screen according to the invention is free from these disadvantages.

To avoid absorption of radiation in the intermediate member, it is preferred that the semiconductor material used for overgrowing the intermediate member on the partly transparent mirror have a wider bandgap than the material of the semiconductor member in which radiation is excited by an electron beam. However, as the intermediate member is not thick, and its thickness is slightly greater than the typical depth of penetration of an electron beam into the laser screen (thickness of the intermediate member ranges from 15 to 30 $\mu$m), the bandgap width of the material of the intermediate member can be equal to, or even slightly smaller than the bandgap width of the semiconductor material of the active component of the laser screen. The lower limit of the bandgap width of the material used for forming the intermediate member is determined by a requirement of a sufficient transparency of this member. If the transparency of the intermediate member is less than 50%, then the laser screen according to the invention would have no advantages with respect to prior art. So the intermediate member with lower limit of thickness about 15 $\mu$m must have an absorption coefficient not more than 500 cm$^{-1}$. This condition may be fulfilled if the bandgap width of the material used for forming the intermediate member is 0.98 times the bandgap width of the semiconductor material of the active component of the laser screen. If the bandgap width of the material of the intermediate member is smaller than this lower limit, brightness of the screen substantially decreases, and lasing efficiency of the laser screen is materially reduced.

The semiconductor member is made of a compound selected from the group consisting of binary, two-component and three component compounds of elements of the second and sixth Groups of the Periodic System. The intermediate member is grown on the partly transparent mirror in a flow-through quartz reactor with an inert transport gas with a compound selected from the group consisting of binary, two-component and three component compounds of elements of the second and sixth Groups of the Periodic System.

The specific choice of compounds for making the semiconductor member and for making the grown intermediate member is aimed at producing an image in the visible and ultraviolet spectral areas. Although the method according to the invention may be used for covering the entire spectral range, including the infrared area, it is well known to those skilled in the art that there are fairly acceptable options of materials (such as $A^{III}B^V$ semiconductors) for making infrared laser screens. For this reason, the specific choice of materials is claimed here to cover the visible and ultraviolet spectral areas.

The intermediate member is grown by chemical deposition from vapor phase. This allows the process to be carried out at lower temperatures (750 to 1100K). The difference between the manufacturing temperature range and the operating temperature range is smaller in this case. For this reason, materials with a greater mismatch between expansion coefficients can be used for making components of the laser screen so that the range of materials that can be used according to the invention can be expanded. Moreover, the lower the overgrowth temperature, the lower is the rate of relative diffusion of atoms between the layers of the laser screen and the lesser is impairment of the active layer. This results in a better efficiency of energy transformation in the laser screen and in a longer service life. Conventional procedures involving metalorganic chemical vapor deposition (MOCVD), metalorganic vapor phase epitaxy (MOVPE) or molecular-beam epitaxy (MBE) growth techniques can also be used which are conducive to still lower temperatures of the process. These procedures are, however, more tedious and require the use of very sophisticated equipment. Other crystal growth technologies such as hot-wall epitaxial growth, a laser sputtering and so on may also be used.

DESCRIPTION OF THE DRAWINGS

The invention will now be described in detail with reference to the accompanying drawings, in which identical details are shown at identical reference numerals and in which.

DESCRIPTION OF PREFERRED EMBODIMENTS

Figure 1:
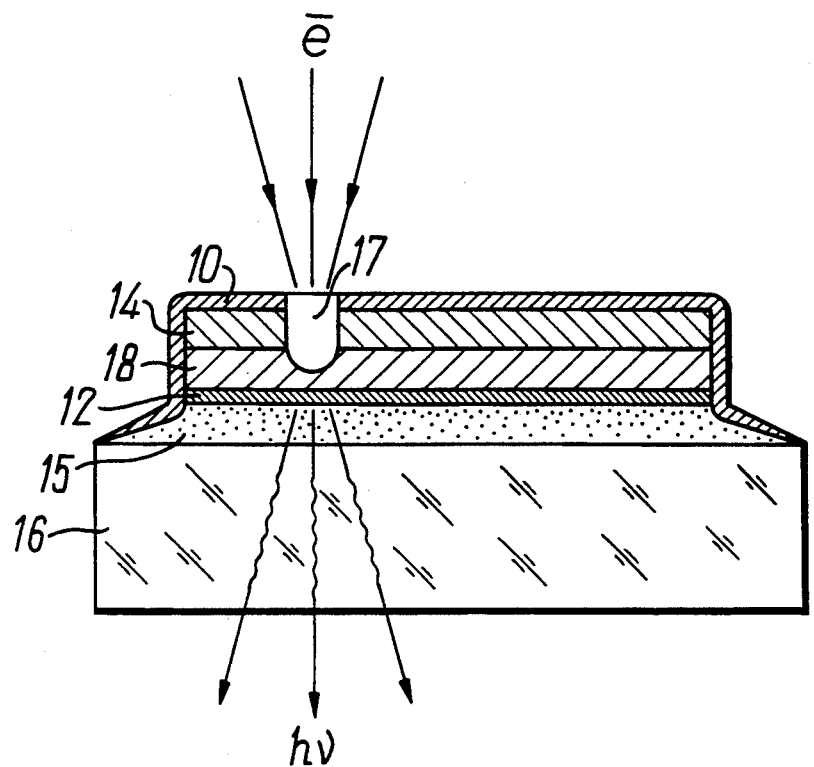
FIG. 1 diagrammatically shows a sectional view of a prior art laser screen for a cathode-ray tube.

With reference to FIG. 1, a prior art laser screen for a cathode-ray tube has an optical cavity formed by a reflecting mirror 10 and a partly transparent mirror 12. A semiconductor member 14 generally in the form of a single-crystal wafer is provided between mirrors 10 and 12 and constitutes an active component of the laser screen which can be excited by means of an electron beam for lasing. For normal operation of the laser screen, it should have a transparent heat removing support member. This support member, which is shown at 16, is cemented at 15 to partly transparent mirror 12. An intermediate member 18 of a semiconductor compound with a greater bandgap width is grown on semiconductor member 14. A zone 17 excited with an electron beam is within the optical cavity formed by mirrors 10 and 12. It can be seen that electromagnetic radiation generated under such excitation is strongly absorbed in intermediate member 18 as the intermediate layer is within the optical cavity and the radiation repeatedly passes through the optical cavity. It should be noted that the intermediate layer, which is within the optical cavity, has a substantial effect on the characteristics of a laser screen such as generation threshold, lasing efficiency, and wavelength. Thickness of intermediate member 18 must be large enough because cementing layer 15 should be spaced to a desired distance from zone 17 excited by an electron beam which is necessary to prolong service life of the screen. In addition, the bandgap width of intermediate member 18 must be large enough in comparison with the bandgap width of semiconductor member 14 so as to lower absorption in the intermediate member. It is, however, difficult to overgrow the passive layer of such compounds by the procedure described above without impairing the emitting efficiency of the active semiconductor. This results in the laser screen shown in FIG. 1 having a low lasing efficiency at room temperature.

Figure 2:
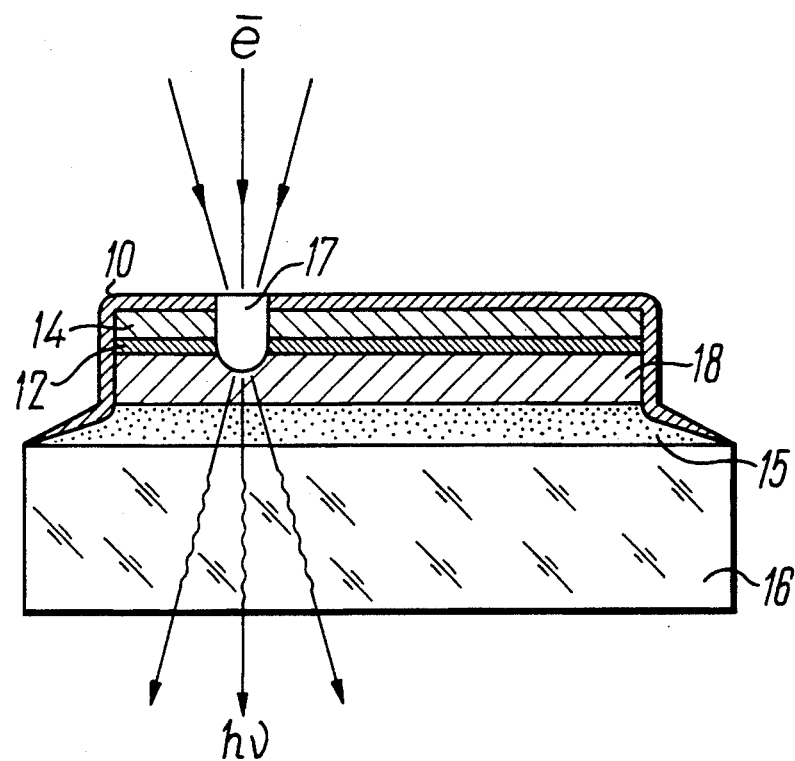
FIG. 2 diagrammatically shows a sectional view of a laser screen for a cathode-ray tube according to the invention.

With reference to FIG. 2, a laser screen according to the invention differs from the prior art laser screen of FIG. 1 by the fact that intermediate member 18 is grown on transparent mirror 12 and is attached to support member 16 by means of cementing layer 15. An energy bandgap width of a polycrystalline semiconductor compound grown on partly transparent mirror 12 is at least 0.98 times as great as the bandgap width of the material of semiconductor member 14. The thickness of the intermediate member should be slightly greater than the typical depth of penetration of an electron beam into the laser screen (thickness of the intermediate member ranges from about 15 to about 30 $\mu$m). The bandgap width of the material of the intermediate member can be even slightly smaller than the bandgap width of the semiconductor material of the active component of the laser screen. The lower limit of the bandgap width of the material used for producing the intermediate member is 0.98 times the bandgap width of the semiconductor material of the active component of the laser screen. If the bandgap width of the material of the intermediate member is smaller than this lower limit, brightness of the screen substantially decreases, and lasing efficiency of the laser screen is materially reduced.

Semiconductor member 14 in the form of a wafer is made of a compound selected from the group consisting of binary, two-component and three component compounds of elements of the second and sixth Groups of the Periodic System. For operation at room temperature, thickness of a single-crystal semiconductor wafer should be equal to a typical depth of penetration of electrons into the laser screen which is 5 to 10 $\mu$m for electron energies ranging from 50 to 75 keV. The full flight distance of electrons along a curved path is, however, about four times as long. Therefore, to prevent electrons from getting into cementing layer 15, thickness of intermediate member 18 has to be of at least 15 to 30 $\mu$m. If intermediate member 18 is grown to a thickness of up to 30 $\mu$m, coefficients of losses through diffusion and absorption in this member at a generation wavelength may range from 30 to 100 cm$^{-1}$. In such case intermediate member 18 may be grown of the same semiconductor compound that is used for making semiconductor member 14. This ensures an ideal agreement between expansion coefficients of semiconductor member 14 and intermediate member 18. It should be noted that the intermediate member may have a bandgap width which is even slightly lower than that of semiconductor member 14 and which may be as low as 0.98 times the bandgap width of the semiconductor member. Thickness of intermediate member 18 may be substantially increased if its composition is changed in comparison with the composition of a similar compound used for making semiconductor member 14 so as to make a bandgap width of intermediate member, e.g., 0.1 eV greater than the bandgap width of semiconductor member 14. In case $A^{II}B^{VI}$ semiconductor compounds such as $CdS_xSe_{1-x}$, (cadmium sulfide selenide) $ZnS_xSe_{1-x}$, (zinc sulfide selenide) $Zn_xCd_{1-x}S$, (zinc cadmium sulfide) and $Zn_{1-x}Cd_xSe$(zinc cadmium selenide) are used the above mentioned increment in the bandgap width can be achieved by a maximum 0.15-fold change in the parameter "x" of the composition.

Partly transparent mirror 12 is formed on the single-crystal semiconductor wafer by vacuum sputtering of oxides. The intermediate member is grown with a compound selected from the group consisting of binary, two-component and three component compounds of elements of the second and sixth Groups of the Periodic System.

The laser screen according to the invention shown in FIG. 2 functions in the following manner. An electron beam penetrates reflecting mirror 10 and semiconductor member 14 to create conditions of optical amplification of its own radiation. As a result conditions are provided within optical cavity 10, 12 for generation of electromagnetic radiation which emerges from the laser screen through partly transparent mirror 12, intermediate member 18, cementing layer 15, and transparent support 16. The radiation is absorbed in intermediate member 18 to a much lesser extent in comparison with the prior art since the intermediate member is outside the optical cavity 10, 12. The electron beam partly enters intermediate member 18 after the passage through partly transparent mirror 12. However, even a small thickness of intermediate member 18 is sufficient to completely prevent the electron beam from getting into cementing layer 15. A surplus of a charge which enters the laser screen with electron beam leaks away through electrically conducting mirror 10 along the screen surface from semiconductor and intermediate members 14 and 18 and from mirror 12 which becomes conductive under the action of the electron beam. Heat, which is mainly released in semiconductor member 14, is removed from the laser screen through the lateral side of transparent heat removing support 16 cooled with a coolant (not shown). All this prolongs service life of the laser screen and makes it more efficient. Moreover, the optical cavity length is determined in this case only by thickness of semiconductor member 14. This results in a lower generation threshold in comparison with the prior art laser screen shown in FIG. 1, with an increase in lasing efficiency.

The above-described laser screen for a cathode-ray tube is made as described below with reference to FIG. 3 which illustrates steps of a method for making a laser screen according to the invention.

Figure 3A:
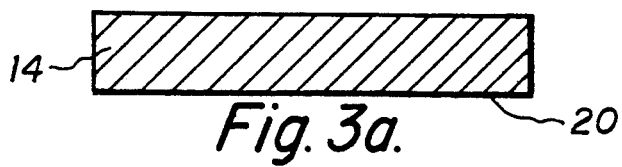
FIGS. 3(a-f) illustrate the progressive steps of a method for making a laser screen for a cathode-ray tube according to the invention.
Figure 3B:
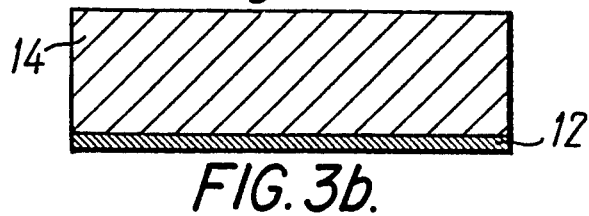

Semiconductor member 14 shown in FIG. 3(a) is made by appropriately cutting a single-crystal wafer off an ingot of a semiconductor compound such as CdS(cadmium sulfide), ZnS(zinc sulfide), ZnSe(zinc selenide), or $CdS_xSe_{1-x}$, $ZnS_xSe_{1-x}$, $Zn_xCd_{1-x}S$, $Zn_{1-x}Cd_xSe$, or $Zn_xCd_{1-x}S_{1-y}Se_y$(zinc cadmium sulfide selenide) which are most widely used for making laser screens for cathode-ray tubes. The wafer is cut off to have a predetermined orientation. One side of the wafer is polished as shown at 20 to obtain a component shown in FIG. 3(a). Partly transparent mirror 12 is formed on polished side 20 of semiconductor wafer 14 as shown in FIG. 3(b). It is preferred that partly transparent mirror 12 be made of a chemically and heat resistant material. Such mirrors are generally made in the form of multiple-layer mirrors consisting of alternating layers of $ZrO_2$(zirconium oxide) and $Al_2O_3$. (aluminum oxide) formed by vacuum sputtering. Other pairs of components with lower or greater indices of refraction such as $SiO_2$-$TiO_2$(silicon oxide-titanium oxide), $SiO_2$-$HfO_2$(silicon oxide-hafnium oxide) may also be used. It is, however, noted that expansion coefficients of $ZrO_2$(zirconium oxide) and $Al_2O_3$(aluminum oxide) are most similar to $A^{II}B^{VI}$ semiconductor compounds which are used for the purposes of this invention. It is, therefore, preferred that these compounds be used for forming partly transparent mirror 12 so as to prolong service life of the laser screen according to the invention and to ensure a better uniformity of lasing. It should be noted that the requirements are imposed upon heat and chemical resistance of partly transparent mirror 12 because this component of the laser screen is then coated with deposited intermediate member 18 in a chemical process conducted at high temperatures. To ensure a strong bond between multiple-layer partly transparent mirror 12 and semiconductor member 14, the sputtering is preferably carried out at a temperature of the wafer ranging from 450 to 600K. If the sputtering is carried out at a temperature below 450K, the mirror can be damaged when support member 16 is grown. If the sputtering is carried out at a temperature above 600K, the surface of semiconductor member 14 is oxidized during the sputtering which can result in a change in the lasing properties of the semiconductor member and of the mirror proper.

Figure 3C:
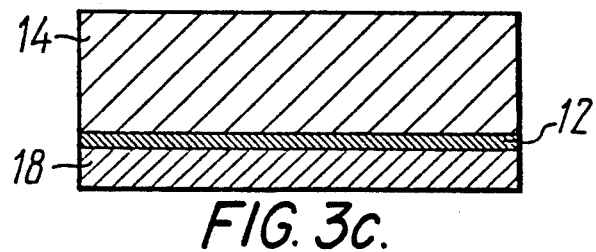

During the next step intermediate member 18 is grown on partly transparent mirror 12 as shown in FIG. 3(c). This intermediate member is of a semiconductor compound with a bandgap width such as to make it transparent for radiation generated by the screen. This is the same compound as the one used for making semiconductor member 14.

Since requirements imposed upon structural properties of the grown intermediate member are not very stringent (because this is a passive layer positioned outside the optical cavity), this intermediate member may be polycrystalline and can be grown at comparatively low temperatures. One of the most efficient methods for overgrowing semiconductor compounds at low temperatures is a method of chemical deposition from vapor phase or a so called CVD growth technique. The temperature range for overgrowing intermediate member 18 and the proportioning of gas flows depend on the intermediate member material and acceptable growth rate. It is preferred that intermediate member 18 be grown at a temperature ranging from 750 to 1100K. This temperature range was found to be an optimum one for uniform lasing and prolonged service life of the laser screen. If the temperature is below 750K, the bond between intermediate member 18 and partly transparent mirror 12 is inadequate (because it is more difficult to obtain a strong bond when a semiconductor is grown on oxides and not vice versa). With a temperature above 1100K, there is a danger of cracking of partly transparent mirror 12 even if the most ideal combination of $ZrO_2$ and $Al_2O_3$ is used. It is most preferred that intermediate member 18 be grown in a flow-through quartz reactor with an inert transport gas such as argon. In a specific preferred embodiment semiconductor member 14 is made of CdS and partly transparent mirror 12 is formed by vacuum sputtering of $ZrO_2$ and $Al_2O_3$ at 450 to 600K. Intermediate member 18 is grown of CdS to a thickness of 15 to 30 μm at 750 to 1100K and with a molar ratio of cadmium vapor to hydrogen sulfide vapor to argon gas of 1–1.5:1:200–400, respectively.

The above-mentioned temperature range and the ratios of gas flows for overgrowing a CdS support member give a growth rate of 0.01 to 0.025 μm/s so that intermediate member 18 can be grown in about 0.5 to 1 hour to a thickness of 15–30 μm. It is understood that these temperatures and proportioning of the components may vary for different semiconductor compounds.

Figure 3D:
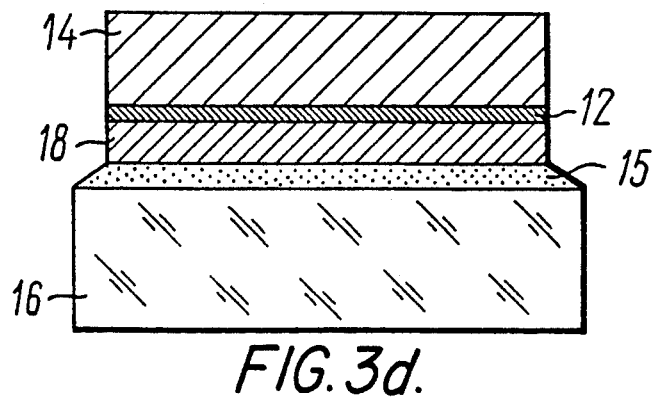
Figure 3E:
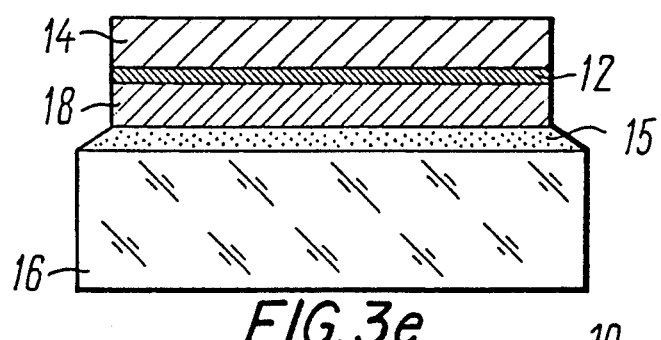
Figure 3F:
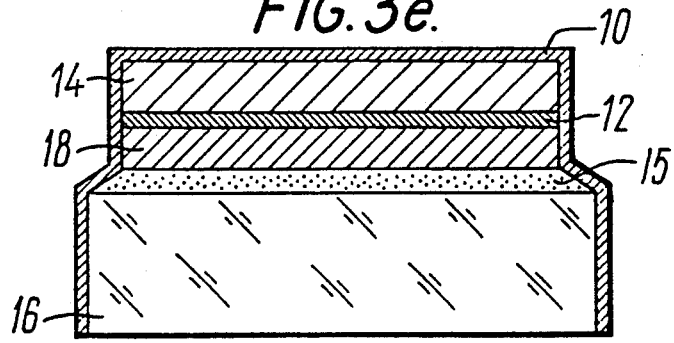

At the next step, the lower side of semiconductor intermediate member 18 is polished to a desired thickness to obtain a polished side 22 as shown in FIG. 3(c) and this side is cemented by cementing layer 15 to transparent support 16 as shown in FIG. 3(d). The opposite side of semiconductor member 14 is then also polished as shown at 24 to obtain the desired thickness of semiconductor member 14 as shown in FIG. 3(e). Reflecting mirror 10, e.g., in the form of a silver layer is then deposited to side 24 of semiconductor member 14 to form the optical cavity with mirror 12 (FIG. 3(f)). At this stage the laser screen manufacture is completed.

The invention will be illustrated by following examples of its practical implementation.

EXAMPLE 1

A wafer 50 mm in diameter and 1.5 mm thick was cut off a single-crystal ingot of CdS with orientation (0001). One side of the wafer was ground and polished mechanically and chemically. A partly transparent mirror coating consisting of eleven quarter-wave layers of $Al_2O_3$ and $ZrO_2$ was sputtered to this side of the wafer at 550K. An intermediate member 30 μm thick was grown of CdS on this coating by a known CVD growth technique in a flow-through quartz reactor at 850K with the molar ratio of cadmium to hydrogen sulfide vapors and to argon of 1.2:1:300. The quartz reactor was a part of quartz tube having an inner diameter about 55 mm. It was placed into a resistive furnace having five temperature zones. Gas flow was introduced into one end of the tube was purified $H_2S$ and Argon. Mass flow controllers maintained the flow rates to within 1%. Purified Cd granules were placed upstream in a crucible inside the tube. The crucible, with the metallic component was heated to 540° C. The semiconductor wafer with the coated mirror facing upstream towards the gas flow was placed into a reactor vertically under some angle with respect to the gas flow. Heating to growing temperature was carried out in an argon (inert gas) atmosphere. The grown intermediate member was polished to a thickness of 25 μm and cemented with an optical epoxy cement to a transparent support member. The opposite side of the semiconductor member was ground and polished mechanically and chemically to a thickness of 10 μm and, a silver coating 0.08 μm thick was sputtered to this polished surface.

The resulting laser screen was used in a cathode-ray tube at room temperature for lasing at 520 nm. When excited with a scanning electron beam with an energy of electrons of 60 to 75 keV, current density of 200 A/sq. cm, electron spot diameter of about 15 μm, and with a scanning speed of $2 \cdot 10^5$ cm/s, this laser screen had an efficiency of transformation of electron beam energy to light (lasing efficiency) of at least 0.07. An estimated service life was about 1000 hours in the TV scanning mode.

An evaluation of service life was made from an experiment in which a television picture was compressed 20 times along a direction of vertical sweeping and a time of falling of output light power up to 80% of former value was measured under controlling an average temperature of the laser screen at nearly room temperature. This time was multiplied by a factor of 20 for evaluation of service life.

For the sake of comparison, a prior art laser screen having a semiconductor layer of CdS of a thickness of 35 μm equal to a total thickness of a semiconductor member of 10 μm and intermediate member of 25 μm, with the same support member and mirrors as described in Example 1 had a lasing efficiency of less than 0.02 at room temperature.

EXAMPLE 2

A laser screen was made as described in Example 1, with the following differences: an interference mirror coating was sputtered at 450K, an intermediate member of CdS was grown to a thickness of 15 μm at 750K and with the ratio of cadmium to hydrogen sulfide vapors and to argon of 1:1:200.

The resulting laser screen was used at room temperature for lasing at 520 nm with a lasing efficiency of at least 0.07. An estimated service life was at least 800 hours in the TV scanning mode. Lasing efficiency was about two times as high as for the prior art laser screen.

EXAMPLE 3

A laser screen was made as described in Example 1, with the following differences: a partly transparent mirror coating was sputtered at 600K, an intermediate member of CdS was grown to a thickness of 20 μm at 1100K and with the ratio of cadmium to hydrogen sulfide vapors and to argon of 1.5:1:400. The grown intermediate member was polished to a thickness of 15 μm.

The resulting laser screen was used at room temperature for lasing at 520 nm with a lasing efficiency of at least 0.06. An estimated service life was at least 1000 hours in the TV scanning mode. The laser screen had a lasing efficiency which was about 1.7 times as high as in the prior art.

EXAMPLE 4

A laser screen for a cathode-ray tube had a semiconductor member of a three-component compound $Zn_{0.04}Cd_{0.96}S$ of a thickness of 15 μm and 50 mm in diameter, having a silver layer of 0.08 μm thick deposited on one side, a nine-layer partly transparent mirror of quarter-wave layers of $SiO_2$ and $TiO_2$ on the other side, and an intermediate member of binary compound CdS 15 μm thick grown on the partly transparent mirror. The laser screen had a transparent heat removing support member of leucosapphire 10 mm thick and 60 mm in diameter cemented to the intermediate member with an optical epoxy cement. The bandgap width of the intermediate member was about 0.98 times as great as that of the compound of the semiconductor member.

The resulting laser screen was used at room temperature for lasing at 512 nm with a lasing efficiency of at least 0.03. An estimated service life was at least 800 hours in the TV scanning mode. A prior art laser screen having an intermediate member with a bandgap width which 0.98 times as great as the bandgap width of the semiconductor member could not work at all at any temperature.

EXAMPLE 5

A laser screen was made as in Example 4 but it had a partly transparent mirror made of eleven alternating layers of $ZrO_2$ and $Al_2O_3$. The semiconductor member was made of a binary CdS compound. The intermediate member was 100 μm thick and was grown of a three-component semiconductor compound $Zn_{0.1}Cd_{0.9}S$ to have bandgap width which was about 1.05 times as great as the bandgap width of the CdS semiconductor member. The laser screen was used for lasing at 520 nm had a lasing efficiency at room temperature which was at least two times as high as in the prior art.

EXAMPLE 6

A laser screen was made as described in Example 5, but the semiconductor member was made of a four-component semiconductor compound $Zn_{0.2}Cd_{0.8}S_{0.9}Se_{0.1}$ and the intermediate member was grown of a four-component semiconductor compound $Zn_{0.3}Cd_{0.7}S_{0.95}Se_{0.05}$ in which the bandgap width was about 1.06 times as great as the bandgap width of the semiconductor member.

This laser screen was at least two times more efficient at room temperature than the prior art laser screen, and its service life was several times as long with lasing at 485 nm.

EXAMPLE 7

A laser screen was made as described in Example 5, but the semiconductor member was made of a three-component semiconductor compound $CdS_{0.5}Se_{0.5}$ and the intermediate member was grown of a three-component compound $Zn_{0.1}Cd_{0.9}S$ in which the bandgap width was about 1.23 times as great as the bandgap width of the semiconductor member.

This laser screen was at least two times more efficient at room temperature than the prior art laser screen, and its service life was several times as long with lasing at 620 nm.

EXAMPLE 8

A laser screen was made as described in Example 5, but the semiconductor member was made of binary compound ZnS, a partly transparent mirror was made of eleven alternating layers of $HfO_2$ and $Al_2O_3$, and an intermediate member was grown also of ZnS in which the bandgap width was as great as the bandgap width of the semiconductor member.

The laser screen was used for lasing at 330 nm at 80K and at 345 nm at 300K with a lasing efficiency of 0.05 and 0.02, respectively. An estimated service life was at least 500 hours in the TV scanning mode at room temperature. A prior art laser screen having a total thickness of the semiconductor layer of 110 μm could not work in the temperature range of 80 to 300K.

Non-limiting explanatory embodiments of the invention have been described above. It is understood that various modifications and supplements may be made by those skilled in the art without going beyond the spirit and scope of the invention as defined in the attached claims.

We claim:

1. A laser screen, comprising:

a heat removing support member;

an optical cavity comprising a partly transparent mirror and a reflecting mirror, operable in response to an applied electron beam for generating laser radiation;

an active semiconductor member constructed of a semiconductor compound positioned between said partly transparent mirror and said reflecting mirror;

an intermediate member made of a semiconductor material transparent for radiation generated in said optical cavity having a bandgap width which is at least 0.98 times as great as the bandgap width of the material of said semiconductor member;

said partly transparent mirror being formed on said semiconductor member;

said intermediate member being grown on said partly transparent mirror; and said heat removing support member being cemented to said intermediate member.

2. The laser screen of claim 1, wherein said semiconductor member is made of a compound selected from the group consisting of binary, two-component and three component compounds of elements of the second and sixth Groups of the Periodic System, and wherein said partly transparent mirror is formed on said semiconductor member by vacuum sputtering of oxides, the intermediate member being grown of a compound selected from the group consisting of binary, two-component and three component compounds of elements of the second and sixth Groups of the Periodic System.

3. A method for making a laser screen having a heat removing support member, an optical cavity comprising a partly transparent mirror and a reflecting mirror, an active semiconductor member which has a first side and a second side opposite to said first side and which is made of a semiconductor compound, and an intermediate member of a semiconductor compound transparent for radiation generated in the optical cavity, said method, comprising the steps of:

polishing a first side of the semiconductor member;

forming a partly transparent mirror on the polished first side of the semiconductor member;

overgrowing on the partly transparent mirror an intermediate member of a semiconductor compound having a bandgap width which is at least 0.98 times as great as that of said semiconductor member;

cementing the support member to the intermediate member;

polishing the second side of the semiconductor member;

forming the reflecting mirror on the second polished side of the semiconductor member.

4. A method of claim 3, wherein said intermediate member is grown by chemical deposition from vapor phase.

5. A method of claim 3, wherein said semiconductor member consists of a single-crystal selected from the group consisting of binary, two-component and three component compounds of elements of the second and sixth Groups of the Periodic System, the intermediate member being grown of a compound selected from the group consisting of binary, two-component and three component compounds of elements of the second and sixth Groups of the Periodic System in a flow-through quartz reactor with an inert transport gas.

6. A method of claim 5, wherein said intermediate member is grown by chemical deposition from vapor phase.

7. A method of claim 6, wherein said semiconductor member is made of CdS and wherein said partly transparent mirror is formed of $ZrO_2$ and $Al_2O_3$ at 450 to 600K, the intermediate member being grown of CdS to a thickness of 15 to 30 $\mu$m at 750 to 1100K and with a molar ratio of cadmium vapor to hydrogen sulfide vapor to argon gas of 1–1.5:1:200–400, respectively.

* * * * *